(12) United States Patent
Hetzler

(10) Patent No.: US 9,437,353 B2
(45) Date of Patent: Sep. 6, 2016

(54) RESISTOR, PARTICULARLY A LOW-RESISTANCE CURRENT-MEASURING RESISTOR

(71) Applicant: Isabellenhuette Heusler GmbH & Co. KG, Dillenburg (DE)

(72) Inventor: Ullrich Hetzler, Dillenburg-Oberscheld (DE)

(73) Assignee: Isabellenhuette Heusler GmbH & Co. KG, Dillenburg (DE)

( * ) Notice: Subject to any disclaimer, the term of this patent is extended or adjusted under 35 U.S.C. 154(b) by 39 days.

(21) Appl. No.: 14/400,551

(22) PCT Filed: Jun. 5, 2013

(86) PCT No.: PCT/EP2013/001648
§ 371 (c)(1),
(2) Date: Nov. 11, 2014

(87) PCT Pub. No.: WO2014/000854
PCT Pub. Date: Jan. 3, 2014

(65) Prior Publication Data
US 2015/0102897 A1      Apr. 16, 2015

(30) Foreign Application Priority Data
Jun. 29, 2012 (DE) .......................... 10 2012 013 036

(51) Int. Cl.
*H01C 1/14*      (2006.01)
*G01R 1/20*     (2006.01)
(Continued)

(52) U.S. Cl.
CPC ................. *H01C 1/14* (2013.01); *G01R 1/203* (2013.01); *H01C 1/148* (2013.01); *H01C 7/13* (2013.01); *H01C 17/00* (2013.01)

(58) Field of Classification Search
CPC .......... H01C 1/14; H01C 17/00; H01C 7/13
USPC ......................................... 338/322
See application file for complete search history.

(56) References Cited

U.S. PATENT DOCUMENTS 2,708,701 A * 5/1955 Viola ..................... G01R 1/203
                                                                 324/126
3,958,209 A * 5/1976 Soda ..................... H01C 7/043
                                                                 252/518.1

(Continued)

FOREIGN PATENT DOCUMENTS

DE      2607026 A1    9/1977
DE      2634232 A1    2/1978
(Continued)

OTHER PUBLICATIONS

WO2006119953 machine translation, Dreiskemper et al., Nov. 2006.*

(Continued)

*Primary Examiner* — Kyung Lee
(74) *Attorney, Agent, or Firm* — Caesar Rivise, PC

(57) ABSTRACT

The invention relates to a resistor, in particular a low-resistance current-measuring resistor, comprising a first connection part (1) that consists of a conductor material for introducing an electrical current (I), a second connection part (2) that consists of a conductor material for discharging said electrical current (I), and a resistor element (3) that consists of a resistor material and is arranged between the two connection parts (1, 2) in the direction of the current, also comprising a resistor coating (7) that consists of a metallic material for the purpose of achieving protection from corrosion, and/or improving solderability. According to the invention, the metallic coating (7) is applied directly to the entire free surface of the resistor element (3) without any insulation layer.

17 Claims, 3 Drawing Sheets

(51) Int. Cl.
*H01C 1/148* (2006.01)
*H01C 7/13* (2006.01)
*H01C 17/00* (2006.01)

(56) References Cited

U.S. PATENT DOCUMENTS

| | | | |
|---|---|---|---|
| 5,258,736 A * | 11/1993 | Kristen | H01C 7/008 219/448.17 |
| 5,436,608 A * | 7/1995 | Togura | H01T 4/12 338/21 |
| 5,464,436 A | 11/1995 | Smith | |
| 5,610,111 A * | 3/1997 | Iwaya | H01C 7/045 252/62.3 T |
| 5,681,111 A * | 10/1997 | Akbar | H01C 7/043 338/22 R |
| 6,200,265 B1 | 3/2001 | Walsh et al. | |
| 6,312,451 B1 | 11/2001 | Streeter | |
| 6,344,790 B1 * | 2/2002 | Ochi | H01C 1/024 338/22 R |
| 6,501,366 B2 * | 12/2002 | Takahashi | G01K 7/22 338/25 |
| 7,937,825 B2 * | 5/2011 | Shato | H01T 4/12 29/610.1 |
| 2003/0016118 A1 | 1/2003 | Schemenaur et al. | |
| 2006/0173514 A1 | 8/2006 | Biel et al. | |

FOREIGN PATENT DOCUMENTS

| | | |
|---|---|---|
| DE | 2607026 B2 | 3/1978 |
| DE | 2607026 C3 | 11/1978 |
| DE | 2634232 C2 | 10/1984 |
| DE | 19814388 A1 | 10/1998 |
| DE | 20115555 U1 | 2/2002 |
| DE | 20207955 U1 | 11/2002 |
| DE | 10128629 A1 | 12/2002 |
| DE | 19780905 C2 | 3/2003 |
| DE | 102004018340 A1 | 11/2005 |
| DE | 19814388 B4 | 5/2006 |
| EP | 0605800 A1 | 7/1994 |
| EP | 0605800 B1 | 3/1996 |
| EP | 0824258 A1 | 2/1998 |
| EP | 0824258 B1 | 10/2004 |
| GB | 2321558 A | 7/1998 |
| WO | 0240098 A1 | 5/2002 |
| WO | 2006119953 A1 | 11/2006 |

OTHER PUBLICATIONS

English-language abstract of DE 201 15 555 U1.
English-language abstract of DE 202 07 955 U1.
English-language translation of abstract and claims of DE 101 28 629 A1.
Partial English-language translation of DE 10 2004 018 340 A1.
Partial English-language translation of WO 0240098 A1.
International Search Report for PCT/EP2013/001648 dated Oct. 8, 2013.
English-language abstract for DE 19814388 A1 (1998).
English-language abstract for EP 0605800 A1 (1994).

* cited by examiner

RESISTOR, PARTICULARLY A LOW-RESISTANCE CURRENT-MEASURING RESISTOR

BACKGROUND OF THE INVENTION

The invention relates to a resistor, particularly a low-resistance current-measuring resistor, and a coating method for coating such a resistor.

A low-resistance current-measuring resistor is known from EP 0 605 800 A1, which consists of two plate-shaped connection parts consisting of a conductor material (e.g. copper) and a plate-shaped low-resistance resistor element consisting of a resistor material (e.g. copper-manganese-nickel alloy) inserted between the connection parts, the voltage drop across the resistor element according to Ohm's Law forming a measurement for the electrical current flowing through the measuring resistor.

With such a current-measuring resistor, the problem is that, without a coating, the material of the connection parts and the resistor element oxidizes so that such current-measuring resistors then turn brown and look unattractive, the solderability also being impaired through the oxidation.

A known method to solve this problem is to galvanically tin-plate or nickel-plate the composite material strip from which the above-described current-measuring resistors are die-cut so that the resistor element on the finished die-cut current-measuring resistors is provided with a coating at least on the topside and on the underside, said coating preventing the interfering oxidation. However, applying the coating before die cutting has the disadvantage that the die flanks and thus the lateral edges of the resistor element have no coating and therefore continue to be exposed to oxidation.

With stringent customer requirements for surface protection, in the past the entire current-measuring resistor was galvanized, as shown in FIG. 6. From this drawing it can be seen that the current-measuring resistor has two connection parts 1, 2, a resistor element 3 being inserted in the direction of current between the two connection parts 1, 2. The oxidation of the connection parts 1, 2 and the resistor element is prevented in this arrangement by a metallic coating 4, which is applied to the current-measuring resistor by galvanization. The problem here is that the galvanized coating 4 is electrically conductive and can therefore falsify the electrical resistance of the resistor element 3 through an electrical bypass through the coating 4. To avoid such falsification of the resistance value, the free surface of the resistor element is coated circumferentially with an electrically-insulating coating 5, which prevents the interfering by-pass through the metallic coating 4. In this way, the interfering oxidation of the surfaces of the connection parts 1, 2 and the resistor element 3 is fully prevented but applying the coating 5 is extremely laborious and has had to be done manually up till now.

Furthermore, DE 197 80 905 C2, which discloses another resistor type, should be mentioned as prior art. In this arrangement, the resistor element is affixed to an electrically insulating substrate and is covered by a metallic coating on its topside. However, firstly, the metallic coating has a lower resistance value than the resistor element in this arrangement and thus forms a substantial electrical by-pass. Secondly, the lateral edges of the resistor element also remain uncovered in this arrangement and can therefore oxidize.

Furthermore, US 2003/0016118 A1, DE 198 14 388 A1, DE 26 34 232 A1 and DE 260 70 26 A1 should be mentioned as prior art.

The object of the invention is therefore to create an appropriately improved resistor. This object is achieved by a resistor according to the invention and by a corresponding coating method according to the invention.

DESCRIPTION OF THE INVENTION

The invention comprises the general technical teaching that the metallic coating is applied without an insulation layer (e.g. paint) directly to the entire free surface of the resistor element. This offers the advantage that the laborious manual application of the electrically insulating paint coating between the metallic coating and the resistor element may be dispensed with, which makes the manufacture of the resistor according to the invention much simpler. Within the scope of the invention, the aforementioned interfering electrical by-pass bypassing the resistor element through the metallic coating can be prevented by various technical measures or can be reduced to a non-interfering level.

In a preferred embodiment of the invention, a special material is selected for this purpose for the coating, said material having sufficiently low electrical conductivity and sufficiently high specific electrical resistance. Nickel-phosphorus (NiP) is preferably used as the material for the metallic coating, particularly with a phosphorus content of approximately 6-8%. However, within the scope of the invention, it is also possible to use other metal coatings, which can contain, for example, nickel, gold, particularly flash gold, silver, palladium or an alloy of the aforementioned materials.

In each case, the metallic material used for the coating preferably has a greater specific electrical resistance than the resistor material of the resistor element.

In addition, the interfering electrical by-pass through the metallic coating can also be minimized by using a relatively thin metallic coating. In the preferred embodiment of the invention, therefore, a nickel-phosphorus layer with a thickness of approximately 3 μm is used. In contrast, for a coating with flash gold, the layer thickness of the metallic coating is preferably less than 2 μm. It is generally the case that the layer thickness of the metallic coating is preferably less than 50 μm, 20 μm, 10 μm, 5 μm, 1 μm, 500 nm or even less than 200 nm. The metallic coating can also consist of two functional layers, e.g. NiP and flash gold.

It has already been mentioned above that the metallic coating leads to an electrical by-pass bypassing the resistor element through the metallic coating. In this arrangement, the resistor according to the invention is preferably constructed so that the resistance value of the by-pass through the metallic coating is less than 10%, 5%, 1%, 0.5% or even less than 0.2% of the resistance value of the resistor element. Thus, the by-pass through the metallic coating preferably has such a high resistance in relation to the resistance value of the resistor element that the by-pass does not falsify a measurement.

In addition, within the scope of the invention it is also intended that the metallic coating does not impair the temperature constancy of the resistance value or only to an acceptable extent. The resistor according to the invention is therefore preferably constructed so that the temperature coefficient of the resistor element with the coating differs only slightly from the temperature coefficient without the metallic coating, the difference being preferably less than 20%, 10%, 5% or 1%.

In addition, it should be mentioned that the metallic coating envelops the resistor element preferably circumferentially, i.e. the entire free surface of the resistor element including the lateral edges. In this way, the resistor according to the invention also differs from the known resistors where the composite material strip is tin-plated or nickel-plated before die-cutting the finished current-measuring resistors as the die-flanks of the finished current-measuring resistor then remain uncoated.

Preferably, the metallic coating actually envelops the entire resistor including the connection parts and the resistor element, the enveloping being preferably circumferential and also including the lateral edges and end faces of the resistor.

It should also be mentioned that the metallic coating preferably consists of a material that is solderable, weldable, bondable and/or corrosion-resistant.

In the preferred embodiment of the invention, the conductor material is copper or a copper alloy in order to achieve the lowest possible electrical resistance in the connection parts. This is sensible so that the measurement result is not falsified by voltage drops inside the connection parts in the case of a 4-conductor measurement (cf. EP 0 605 800 A1).

In addition, it should be mentioned that the resistor material is preferably a copper alloy, particularly a copper-manganese-nickel alloy, for example, Cu84Ni4Mn12 (Manganin®). However, there is also the alternative option that the resistor material of the resistor element is a nickel alloy, for example NiCr or CuNi.

In addition, it should be mentioned in relation to the conductor material and resistor material that the resistor material of the resistor element preferably has a greater specific electrical resistance than the conductor material of the connection parts.

Regarding the design of the resistor according to the invention, it should be mentioned that the resistor element is electrically and mechanically connected to the two adjacent connection parts, particularly by a weld joint, electron beam welding being particularly suitable, as described for example in EP 0 605 800 A1.

In the preferred embodiment of the invention, the two connection parts are arranged on opposite sides of the resistor element so that the electrical current flows in and discharges on opposite sides of the resistor element.

However, it is also possible that the two connection parts are arranged on the same side of the resistor element so that the electrical current flows in and discharges on the same side of the resistor element.

The two alternatives described above are also described in detail in EP 0 605 800 A1 so that the content of this document must be attributed in its entirety to the present description.

It should also be mentioned in this context that the connection parts and/or the resistor element are preferably constructed as a plate shape, which enables inexpensive manufacture from a composite material, as described for example in EP 0 605 800 A1.

The plate-shaped connection parts and the plate-shaped resistor element are preferably flat and lie on a common plane so that the resistor according to the invention is also flat in its entirety.

However, there is also the alternative option that the plate-shaped connection parts and/or the plate-shaped resistor element are curved or curved during the die-cutting process or curved according to the requirements. In this way, it is possible that the resistor element in the assembled state is distanced from a printed circuit board, which leads to good cooling of the resistor element or simplifies the installation of the part.

In addition, it should be mentioned that the resistor according to the invention is preferably a resistor for assembly in busbars. However, the method is also applicable to SMD resistors (SMD: Surface Mounted Device), which are suitable for surface assembly on a printed circuit board.

As is known, it is desirable for the resistance value to have an optimally good temperature constancy for use as a current-measuring resistor. The resistor material used therefore preferably has a specific electrical resistance with a very small temperature coefficient, which is preferably less than $5 \cdot 10^{-4}$ $K^{-1}$, $2 \cdot 10^{-4}$ $K^{-1}$, $1 \cdot 10^{-4}$ $K^{-1}$ or $5 \cdot 10^{-5}$ $K^{-1}$.

It has already been mentioned above that the resistor material is preferably a low-resistance resistor material, which is why the specific electrical resistance of the resistor material is preferably less than $2 \cdot 10^{-4}$ $\Omega m$, $2 \cdot 10^{-5}$ $\Omega m$ or $2 \cdot 10^{-6}$ $\Omega m$.

In contrast, the conductor material of the connection parts preferably has an even smaller specific electrical resistance of less than $10^{-5}$ $\Omega m$, $10^{-6}$ $\Omega m$ or $10^{-7}$ $\Omega m$.

Finally, it should also be mentioned that the invention is not restricted to a resistor according to the invention as a finished component but also claims protection for an appropriate coating method, whereby the sequence of the coating method according to the invention already emerges from the preceding description so that, to avoid repetition, reference is made to the preceding description.

Regarding the coating method, it should be noted in addition that the metallic coating can be coated galvanically or chemically, particularly by a barrel plating method, which is known per se from the prior art. In this method, the uncoated resistors are galvanically or chemically coated while rotating in a barrel. Other coating methods such as sputtering or CVD (Chemical Vapor Deposition) etc. are naturally also possible.

BRIEF DESCRIPTION OF THE DRAWINGS

Further advantageous embodiments of the invention are identified in the subclaims or are explained in more detail in the following drawings together with the description of the preferred embodiments of the invention, in which:

FIGS. 1 to 4 show a current-measuring resistor 6 according to the invention, which is largely consistent with the conventional current-measuring resistor described above and shown in FIG. 6, so that to avoid repetitions reference is made to the preceding description, with the same reference numbers being used for the corresponding details.

Figure 1:
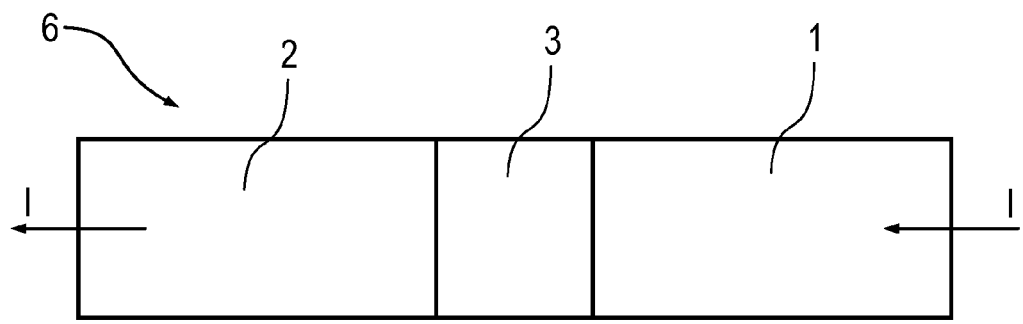
FIG. 1 is a view of a current-measuring resistor according to the invention.
Figure 2:
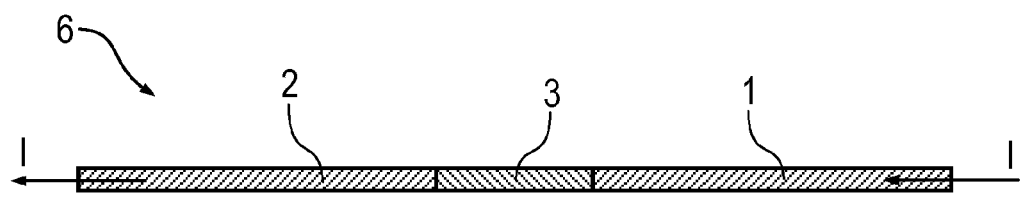
FIG. 2 is a lateral view of the current-measuring resistor in FIG. 1.
Figure 3:
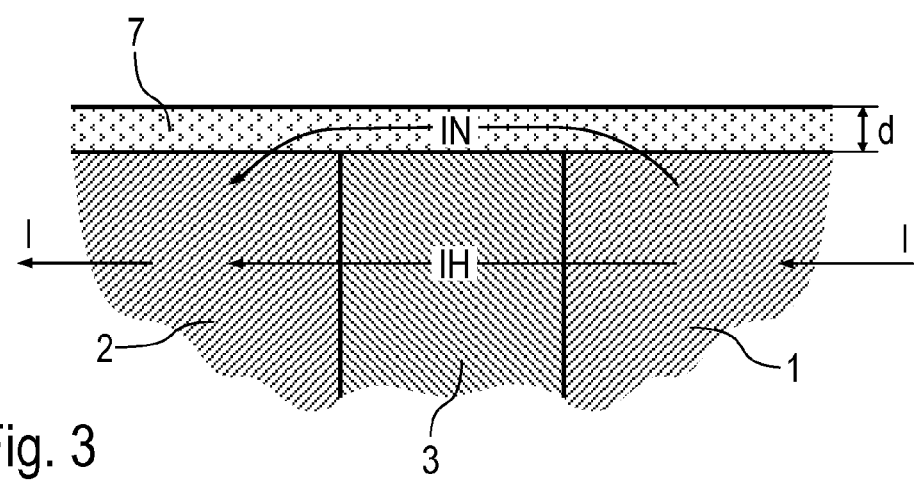
FIG. 3 is an enlarged cross-sectional view of the current-measuring resistor in FIGS. 1 and 2.

In this arrangement, the two connection parts 1, 2 are each constructed as a plate shape and consist of copper or a copper alloy.

The resistor element 3 is also constructed as a plate shape and consists of a copper-manganese-nickel alloy, for example Cu84Ni4Mn12 (Manganin®).

Otherwise, reference is made to the document EP 0 605 800 A1 regarding the manufacture and assembly of the current-measuring resistor 1 according to the invention, said content of the document therefore being attributable in its entirety to the present description.

In this arrangement, the connection part 1 serves to introduce an electrical current I into the current-measuring resistor 6 while the connection part 2 has the function of discharging the electrical current I out of the current-measuring resistor 6.

In this arrangement, the free surface of the resistor element 3 is coated circumferentially with a metallic coating 7, which in this embodiment consists of nickel-phosphorus with a phosphorus content of 6-8%.

It should be mentioned here that the metallic coating 7 not only envelops the resistor element 3 but the entire current-measuring resistor 6 including the two connection parts 1, 2.

On the one hand, the metallic coating 7 prevents interfering oxidation on the surface of the connection parts 1, 2 and the resistor element 3. But, in addition, the metallic coating 7 also improves solderability.

Figure 6:
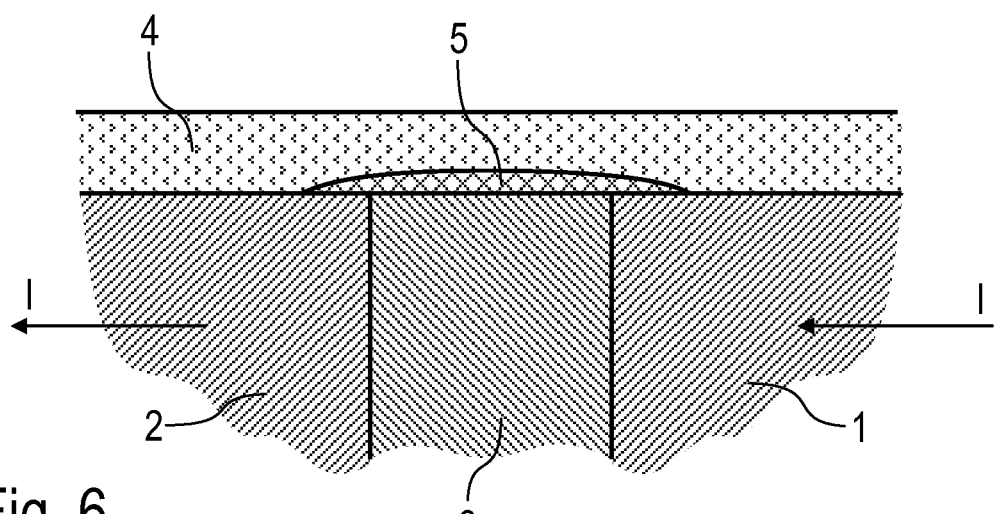

In this arrangement, it should be mentioned that the current-measuring resistor 6 according to the invention differs from the conventional current-measuring resistor shown in FIG. 6 in that the metallic coating 7 is applied directly to the surfaces of the connection parts 1, 2 and the resistor element 3, i.e. without the paint coating 5 in between according to FIG. 6. This offers the advantage that the laborious manual application of the paint coating 5 can be dispensed with, which enables much simpler manufacture of the current-measuring resistor 6 according to the invention.

In this arrangement, the otherwise interfering electrical by-pass bypassing the resistor element 3 through the metallic coating 7 is prevented through various technical measures.

On the one hand, the metallic coating 7 consists of nickel-phosphorus, which has sufficiently low electrical conductivity, whereby the electrical by-pass through the metallic coating 7 is strongly reduced.

In addition, the metallic coating 7 has an extremely small layer thickness $d \approx 3$ μm, whereby the by-pass is further reduced.

Figure 4:
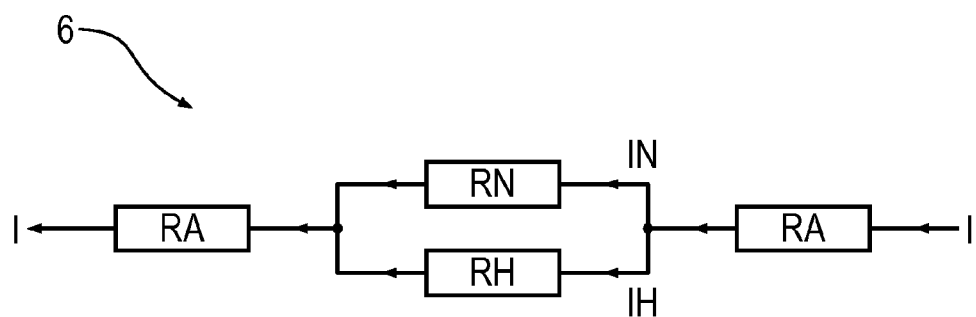
FIG. 4 is an equivalent circuit diagram for the current-measuring resistor according to the invention to clarify the electrical by-pass through the metallic coating of the resistor element.

FIG. 4 shows an equivalent electrical circuit diagram of the current-measuring resistor 6 according to the invention with resistors RA for the connection parts 1, 2, a resistor RH for the resistor element 3 and a resistor RN for the by-pass bypassing the resistor element 3 through the metallic coating 7. The fed-in electrical current I therefore divides into a main current IH through the resistor element 3 and a by-pass current IN through the metallic coating 7 or, more precisely, through the resistor RN of the metallic coating 7. In this arrangement, the current-measuring resistor 6 according to the invention is constructed so that the by-pass current IN is less than the main current IH by several powers of ten.

Figure 5:
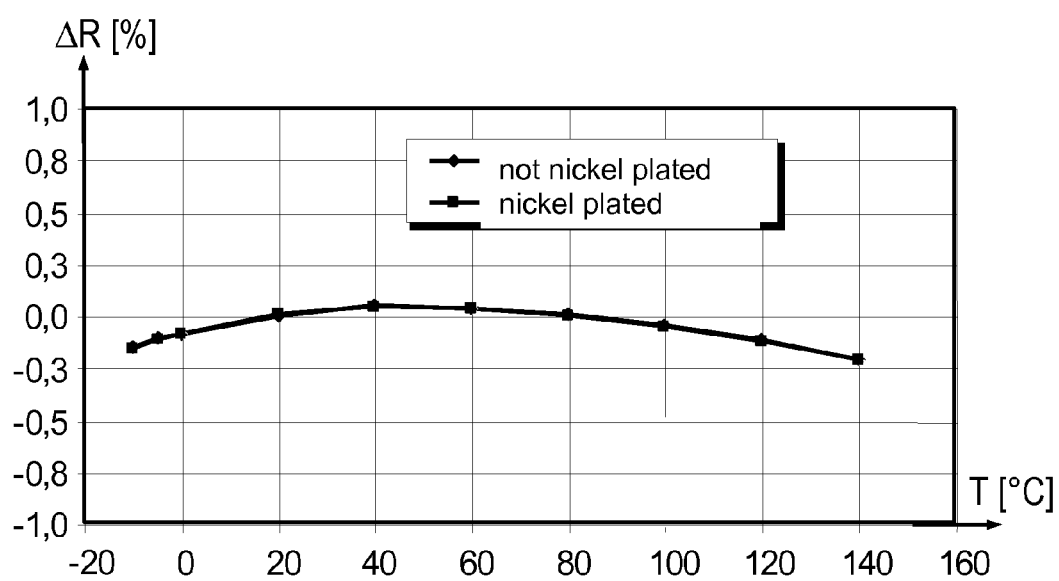
FIG. 5 is a diagram to clarify the temperature-induced resistance change and FIG. 6 is an enlarged detailed view according to FIG. 3 for a conventional current-measuring resistor.

Finally, FIG. 5 shows the temperature-induced change in total resistance of the current-measuring resistor according to the invention, firstly for a raw state without the metallic coating 7 and secondly with the metallic coating 7, which here consists of nickel. It can be seen from the diagram that the temperature constancy is at the most inappreciably impaired by the metallic coating 7.

The invention is not restricted to the preferred embodiment described above. Rather, a plurality of alternatives and modifications are possible, which also make use of the inventive concepts and thus fall within the scope. In addition, the invention also claims protection for the subject and the features of the subclaims independently of the claims referred to.

LIST OF REFERENCE NUMBERS

1 Connection part
2 Connection part
3 Resistor element
4 Metallic coating
5 Paint
6 Current measuring resistor
7 Metallic coating
d Layer thickness of the metallic coating
RA Resistance of connection parts
RN Resistance of by-pass
RH Resistance of resistor element
IH Main current through the resistor element
IN Current through the by-pass through the metallic coating
I Total current

The invention claimed is:

1. A resistor comprising:
   a) a first connection part comprising a conductor material for introducing an electrical current into the resistor,
   b) a second connection part comprising a conductor material for discharging the electrical current from the resistor,
   c) a resistor element comprising a resistor material, the resistor element being arranged in a direction of a current between the first connection part and the second connection part, and
   d) a metallic coating of the resistor comprising a metallic material to achieve at least one of corrosion protection and improved solderability,
   wherein:
   e) the metallic coating is applied without an insulation layer directly to an entire free surface of the resistor element
   f) the metallic coating together with the resistor element forms an electrical bypass between the first and second connection parts,
   g) the electrical bypass through the metallic coating has a specific electrical conductance value,
   h) the resistor element has a specific electrical conductance value between the first and second connection parts, and
   i) the electrical conductance value of the electrical bypass is lower than 10% of the electrical conductance value of the resistor element.

2. The resistor according to claim 1, wherein the metallic coating has a layer thickness of less than 50 μm.

3. The resistor according to claim 1, wherein the metallic material of the coating has a greater specific electrical resistance than the resistor material of the resistor element.

4. The resistor according to claim 1, wherein the metallic material is a member selected from the group consisting of the following materials:
   a) nickel,
   b) nickel-phosphorus,
   c) gold,
   d) silver,
   e) palladium, and
   f) an alloy of the aforementioned materials.

5. The resistor according to claim 1, wherein
   a) the resistor without the metallic coating has an electrical resistance value with a specific temperature coefficient, b) the resistor with the metallic coating has an electrical resistance value with a specific temperature coefficient, and c) the temperature coefficient with the coating differs by less than 20% from the temperature coefficient without the coating.

6. The resistor according to claim 1, wherein the metallic coating completely envelops the resistor including the first and second connection parts and the resistor element.

7. The resistor according to claim 1, wherein the metallic coating is at least one of solderable, weldable, bondable and corrosion-resistant.

8. The resistor according to claim 1, wherein
a) the conductor material of the connection parts is copper or a copper alloy and
b) the resistor material of the resistor element is a copper alloy, and
d) the resistor element is electrically and mechanically connected to the first and second connection parts.

9. The resistor according to claim 1, wherein the first and second connection parts are arranged on opposite sides of the resistor element.

10. The resistor according to claim 1, wherein at least one of the first and second connection parts and the resistor element are plate-shaped.

11. The resistor according to claim 10, wherein at least one of the plate-shaped connection parts and the plate-shaped resistor element are flat.

12. The resistor according to claim 10, wherein at least one of the plate-shaped connection parts and the plate-shaped resistor element are curved.

13. The resistor according to claim 1, wherein
a) the resistor material has a specific electrical resistance with a temperature coefficient of less than $5 \cdot 10^{-4}$ $K^{-1}$, and
b) the resistor material has a specific electrical resistance which is less than $2 \cdot 10^{-4}$ $\Omega \cdot m$, and
c) the conductor material has a specific electrical resistance which is less than $10^{-5}$ $\Omega \cdot m$.

14. A coating method for coating an electrical resistor comprising applying a metallic coating to a resistor element of the electrical resistor to achieve at least one of corrosion protection and improved solderability, wherein,
a) the metallic coating is applied without an insulation layer directly to an entire free surface of the resistor element;
b) the metallic coating together with the resistor element forms an electrical bypass between a first connection part and a second connection part, said first connection part comprising a conductor material for introducing an electrical current into the resistor, and said second connection part comprising a conductor material for discharging the electrical current from the resistor,
c) the electrical bypass through the metallic coating has a specific electrical conductance value,
d) the resistor element has a specific electrical conductance value between the first and second connection parts, and
e) the electrical conductance value of the electrical bypass is lower than 10% of the electrical conductance value of the resistor element.

15. The coating method according to claim 14, wherein the metallic coating is applied as a galvanized coating to the resistor element.

16. The coating method according to claim 15, wherein the metallic coating is applied as a single coating using a barrel plating method.

17. The coating method according to claim 14, wherein the metallic coating is applied chemically to the resistor element.

* * * * *